(12) United States Patent
Shiraishi

(10) Patent No.: US 6,217,648 B1
(45) Date of Patent: Apr. 17, 2001

(54) SINGLE CRYSTAL PULL-UP APPARATUS AND SINGLE CRYSTAL PULL-UP METHOD

(75) Inventor: Yutaka Shiraishi, Annaka (JP)

(73) Assignee: Super Silicon Crystal Research Institute Corporation, Gunma (JP)

(*) Notice: Subject to any disclaimer, the term of this patent is extended or adjusted under 35 U.S.C. 154(b) by 0 days.

(21) Appl. No.: 09/284,834

(22) PCT Filed: Aug. 26, 1998

(86) PCT No.: PCT/JP98/03787

§ 371 Date: Apr. 21, 1999

§ 102(e) Date: Apr. 21, 1999

(87) PCT Pub. No.: WO99/13138

PCT Pub. Date: Mar. 18, 1999

(30) Foreign Application Priority Data

Sep. 5, 1997 (JP) .................................................. 9-256153

(51) Int. Cl.[7] .................................................. G30B 15/20
(52) U.S. Cl. .............................. 117/14; 117/15; 117/217; 117/218; 117/911
(58) Field of Search ................................ 117/13, 14, 15, 117/208, 217, 218, 911

(56) References Cited

U.S. PATENT DOCUMENTS 3,937,623 * 2/1976 Kononok et al. ...................... 65/88
4,145,201 * 3/1979 Phillips ...................... 65/2

FOREIGN PATENT DOCUMENTS

| 63-252991 | 10/1988 | (JP) . |
| 3-285891 | 12/1991 | (JP) . |
| 3-295892 | 12/1991 | (JP) . |
| 7-172981 | 7/1993 | (JP) . |
| 5-194082 | 8/1993 | (JP) . |
| 5-270974 | 10/1993 | (JP) . |
| 5-270975 | 10/1993 | (JP) . |
| 10-81581 | 3/1998 | (JP) . |
| 10-139585 | 5/1998 | (JP) . |

* cited by examiner

*Primary Examiner*—Felisa Garrett
(74) *Attorney, Agent, or Firm*—McDermott, Will & Emery

(57) ABSTRACT

With relatively simple arrangement and at low cost, the present invention provides a single crystal pulling apparatus, by which it is possible to prevent a single crystal from being turned to polycrystal, to move the crystal itself smoothly and gently from a necking portion during pulling operation of the single crystal, and to reliably hold the single crystal even in case of trouble such as power suspension. The apparatus comprises a support base 13 as a dish-shaped member to support a portion with larger diameter 30 from below under a seed crystal 21, pulley means 4 for rotating the support base and being movable between a position where the support base does not support the lower end of the portion with larger diameter of the single crystal and a position where it supports the lower end of the portion with larger diameter depending on the rotation angle, pulley rotating means 3a and 3b for rotating the pulley means and moving said support base between said two positions, and pulling lifting means 3a and 3b for moving up said support base by lifting the pulley means while controlling the rate.

15 Claims, 10 Drawing Sheets ically, the present invention provides a single crys-

SINGLE CRYSTAL PULL-UP APPARATUS AND SINGLE CRYSTAL PULL-UP METHOD

FIELD OF THE INVENTION

The present invention relates to a single crystal pulling apparatus and a single crystal pulling method for manufacturing a dislocation-free single crystal of Si (silicon) by pulling Czochralski (CZ) method.

BACKGROUND ART

In general, in a single crystal manufacturing apparatus based on the pulling CZ method, pressure in a highly pressure-proof airtight chamber is reduced to about 10 torr, and fresh argon (Ar) gas is sent into it. Polycrystals in a quartz crucible placed at the lower portion of the chamber are heated and molten, and seed crystal is immersed from above into the surface of the melt. Then, the seed crystal and the quartz crucible are rotated and moved up and down, and the seed crystal is pulled up. At the same time, a single crystal is grown, which comprises an upper cone portion in shape of a cone with its upper end protruding under the seed crystal and a lower cone portion in shape of a cone with a part of cylindrical body and the lower end protruded (the so-called ingot).

As the method to grow the crystal, Dash method is known. In this method, in order to eliminate dislocation (to turn to dislocation-free), which occurs on a seed crystal by thermal shock when the seed crystal is immersed into the surface of a melt, pulling rate is relatively quickened after immersing the seed crystal into the surface of the melt, and a portion with smaller diameter than the diameter of the seed crystal or a neck portion of 3–4 mm in diameter is formed, and then, the pulling operation of the upper cone portion is started.

Further, a single crystal with larger diameter and heavier weight (150–200 kg or more) cannot be pulled up via the neck portion with smaller diameter, and the following method has been proposed in the Japanese Patent Publication 5-65477, for example: After the neck portion with smaller diameter has been formed by Dash method, the pulling rate is relatively slowed down to form a portion with larger diameter. Then, the pulling rate is relatively quickened to form a portion with smaller diameter. Thus, "a spherical constricted portion" is formed, and by holding this constricted portion by a holder, a single crystal with larger diameter and heavier weight can be pulled up. As the conventional apparatus to hold the constricted portion, those disclosed in Japanese Patent Publications 7-103000 and 7-515 are known.

Also, a method to hold a part of the crystal body without forming the constricted portion as described above has been disclosed in Japanese Patent Publications Laid-Open 5-270974 and 7-172981. Further, Japanese Patent Publications Laid-Open 63-252991 and 5-270975 have proposed a method to form an "annular constricted portion" with diameter larger than that of the body portion between the upper cone portion and the body portion instead of the "spherical constricted portion" as described above and to hold this "annular constricted portion".

However, the single crystal pulling process is a process, which is very sensitive to vibration from outside and the crystal can be easily turned to polycrystal. Therefore, the problem in the pulling operation of the single crystal lies in that the crystal itself must be smoothly and gently moved from the necking position toward holding position such as the constricted portion without giving disturbances from outside. The holders as used in the past are mostly of squeezing type to squeeze the portion with larger diameter or straight body of the single crystal using two or more component members. In adopting such a structure, the squeezing force may be lost during trouble such as power suspension, and the single crystal may be dropped down. Further, because of high temperature inside the pulling furnace, holding mechanism must have heat-resistant property. Also, dust and particles generated from mechanical friction parts such as driving units must be removed as far as possible because these may adversely affect the single crystal. None of the conventional methods can perfectly solve all of these problems.

DISCLOSURE OF THE INVENTION

To solve the above problems, it is an object of the present invention to provide a single crystal pulling apparatus with relatively simple arrangement and produced at low cost. By such an apparatus, it is possible to prevent the single crystal from being turned to polycrystal during pulling operation when the single crystal is held by the holder, to move the crystal itself smoothly and gently from the necking portion to a holding position such as a constricted portion during single crystal pulling operation, and to reliably hold the single crystal even in case of trouble such as power suspension.

To attain the above object, the apparatus according to the present invention uses a support base as a dish-like member to hold a portion with larger diameter by supporting and placing it from below, which is formed under the seed crystal, and the support base is rotated by pulley means, and the support base can be moved between a position not to support and a position to support the lower end of the constricted portion and/or the portion with larger diameter of the single crystal depending on rotation angle, and by lifting the pulley means while controlling the lifting rate, a single crystal is grown by moving up the support base.

Also, the apparatus may comprise both the means for rotating the pulley means and the means for lifting the pulley means as the winding mechanism. Or, only the latter means may be designed as a winding mechanism, and the former means may be designed as means for moving a part of wire in horizontal direction.

Specifically, the present invention provides a single crystal pulling apparatus, which comprises rotating means for rotating a seed crystal holder around pulling direction to support a seed crystal above a crucible capable to hold a molten crystal, seed crystal pulling means for pulling up the seed crystal by moving up the seed crystal holder while controlling pulling rate, a support base as a dish-like member to support a portion with larger diameter by supporting and placing the portion with larger diameter formed under the seed crystal, pulley means for rotating the support base and being movable between a position not to support and a position to support the lower end of a constricted portion and/or the portion with larger diameter of a single crystal depending on rotation angle, pulley rotating means for rotating the pulley means and for moving the support base between the two positions, pulley lifting means for moving up the support base by lifting up the pulley means while controlling the lifting rate, and means for rotating the pulley rotating means and the pulley lifting means around pulling direction of the seed crystal.

Also, the present invention provides a single crystal pulling apparatus, which comprises rotating means for rotating a seed crystal holder around pulling direction to support a seed crystal above a crucible capable to hold a molten crystal, seed crystal pulling means for pulling up the seed crystal by moving up the seed crystal holder while controlling the pulling rate, a support base having a through-hole to receive a constricted portion of a single crystal to support the lower end of the constricted portion and/or a portion with larger diameter below the portion with larger diameter formed under the seed crystal and provided with a slit for communicating the through-hole with outer peripheral portion in order to guide the constricted portion through the through-hole, pulley means being movable between a position not to support and a position to support the lower end of the constricted portion and/or the portion with larger diameter of the single crystal depending on rotation angle, pulley rotating means for rotating the pulley means and controlling rotating angular position, pulley lifting means being rotatable together with the seed crystal holder and for lifting up the pulley rotating means while controlling the lifting rate, and capable to grow the single crystal by moving up the support base, and means for rotating the pulley rotating means and pulley lifting means around pulling direction of the seed crystal.

Further, the present invention provides a single crystal pulling method using a single crystal pulling apparatus according to claim 1 or 2, wherein said method comprises: a step of forming a portion with larger diameter by controlling the pulling rate with said seed crystal being pulled up by said seed crystal pulling means; a step of positioning said support base under said portion with larger diameter with said support base being rotated by said pulley rotating means; a step of lifting said pulley lifting means; a step of detecting that the measured load is at a predetermined value by measuring a load on said seed crystal pulling means; and a step of starting to control the rate for single crystal growth by said pulley lifting means by stopping to control the rate for single crystal growth by said seed crystal pulling.

Figure 1:
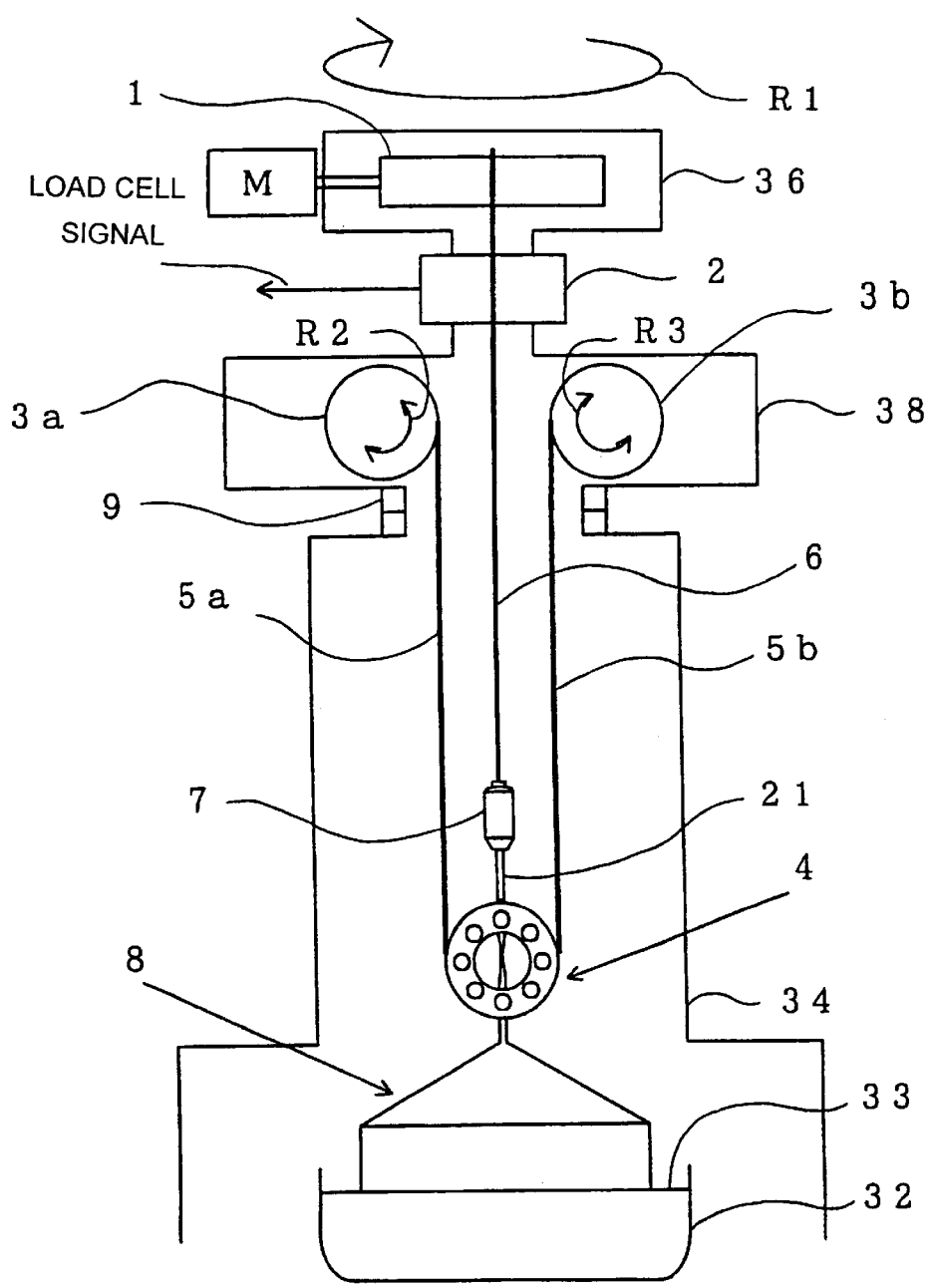
FIG. 1 is a partial cross-sectional view schematically showing a first embodiment of a single crystal pulling apparatus according to the present invention.

1 Winding apparatus
2 Load cell
3a, 3b, 3c, 3d, 3e Winding drums
4 Pulley assembly
5a, 5b, 5a-1, 5a-2, 5b-1, 5b-2, 16a-1, 16a-2, 16b-1, 16b-2 wires
6 Seed crystal pulling wire
7 Seed crystal holder
8 Single crystal (single crystal main body)
9 Ball bearing
10 Through-hole
10A Recess
11 Slit
12a, 12b Pulleys
13 Dish-like member
14a, 14b Balance weights
15 Rotation center of pulley
18a, 18b Connecting rods
17a-1, 17a-2, 18b-1, 18b-2 Wire engaging units
19a, 19b Wire stoppers
21 Seed crystal
22 Dash's neck
23 Narrow single crystal portion
30 Portion with larger diameter
31 Constricted portion
32 Quartz crucible
33 Si melt
34 Mechanical chamber
36, 38, 38A Chambers
40a-1, 40a-2, 40b-1, 40b-2, 41a, 41b Fixed pulleys
40a-3, 40b-3 Movable pulleys
42 Linearly moving pulleys
44 Link
46a, 46, Gears
48, M Motors

BEST MODE FOR CARRYING OUT THE INVENTION

In the following, description will be given on embodiments of the present invention referring to the attached drawings. FIG. 1 is a drawing for schematically showing an essential portion of a first embodiment of a single crystal pulling apparatus and a pulling process of the present invention. In FIG. 1, a winding apparatus 1 is to wind up a seed crystal pulling wire 6. At the tip of the seed crystal pulling wire 6, a seed crystal holder 7 is mounted, and a seed crystal 21 is attached on the seed crystal holder 7. In this figure, a mechanical chamber 34 is shown, which forms a vacuum chamber to accommodate a single crystal 8 to be grown and a quartz crucible 32. The winding apparatus 1 comprises a drum, which is rotated around an axis perpendicular to pulling direction (axial direction of the wire 6) by a motor M. As to be described later, it is also designed in such manner that it is rotated in the direction of an arrow R1 around the pulling direction. A load applied on the wire 6 is detected by a load cell 2, and a load cell signal is outputted.

The winding apparatus 1 is accommodated in a chamber 36 and it is integrally connected with a lower chamber 38. These chambers 36 and 38 can be rotated by a motor (not shown) around the pulling direction with respect to the mechanical chamber 34. The chamber 38 is rotatably mounted on the mechanical chamber 34 via a bearing 9. Inside the chamber 38, two winding drums 3a and 3b are rotatably mounted. These winding drums 3a and 3b are rotated in normal and reverse directions as shown by arrows R2 and R3 by means of a motor (not shown), and these drums are designed in such manner that two wires 5a and 5b mounted on a pulley assembly 4 are separately wound up respectively.

Figure 2:
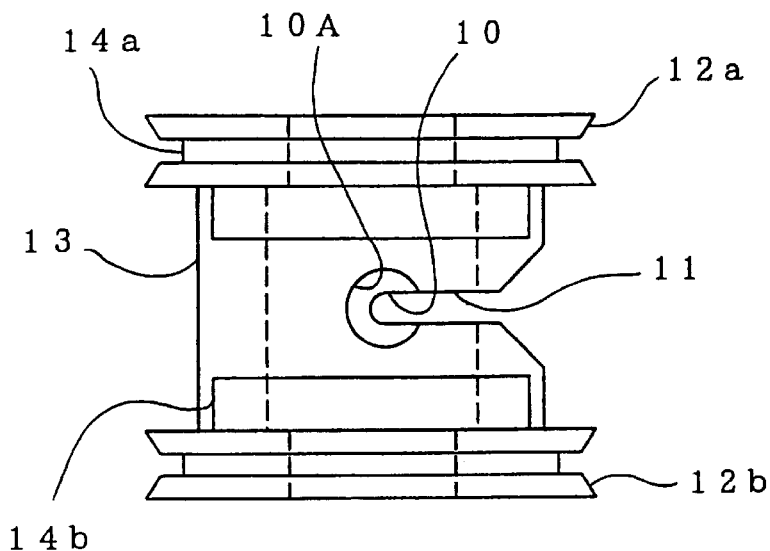
FIG. 2 is a plan view showing pulley means in FIG. 1 and a dish-like member mounted on the pulley means.
Figure 3:
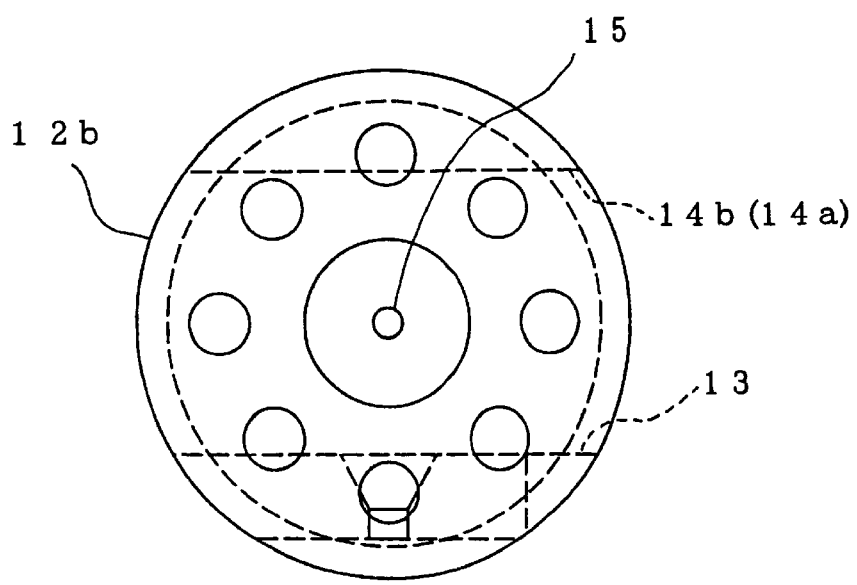
FIG. 3 is a front view of the pulley means of FIG. 1.
Figure 4:
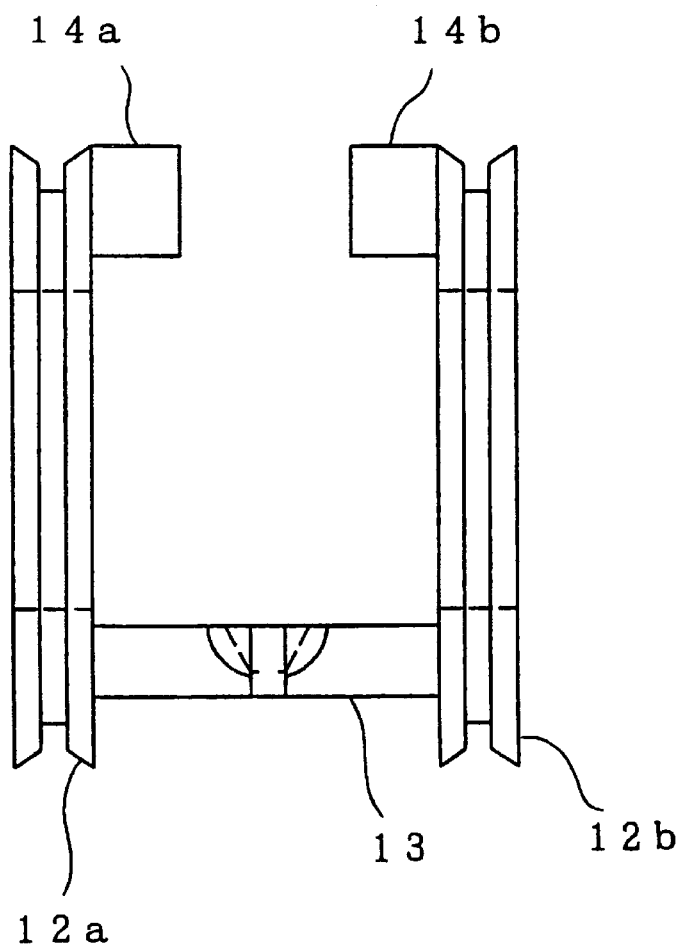
FIG. 4 is a side view of the pulley means of FIG. 1.

As shown in FIG. 2 to FIG. 4, the pulley assembly 4 comprises two pulleys 12a and 12b arranged in parallel to each other, and a dish-like member 13 disposed between the pulleys 12a and 12b. On the pulleys 12a and 12b, counterbalance weights 14a an 14b are mounted respectively. Because the counterbalance weights 14a and 14b are mounted on the dish-like member 13, the center of gravity is not shifted from the center depending on the rotating position. As shown in FIG. 3 and FIG. 4, the balance weights 14a and 14b are placed at opposite positions with the rotation center 15 of the pulleys 12a and 12b in the middle. As shown in FIG. 2, the dish-like member 13 has a through-hole 10 approximately at the center, and the through-hole 10 is communicated with outer peripheral portion via a slit 11. Near the through-hole 10, a tapered recess 10A is formed.

Figure 5:
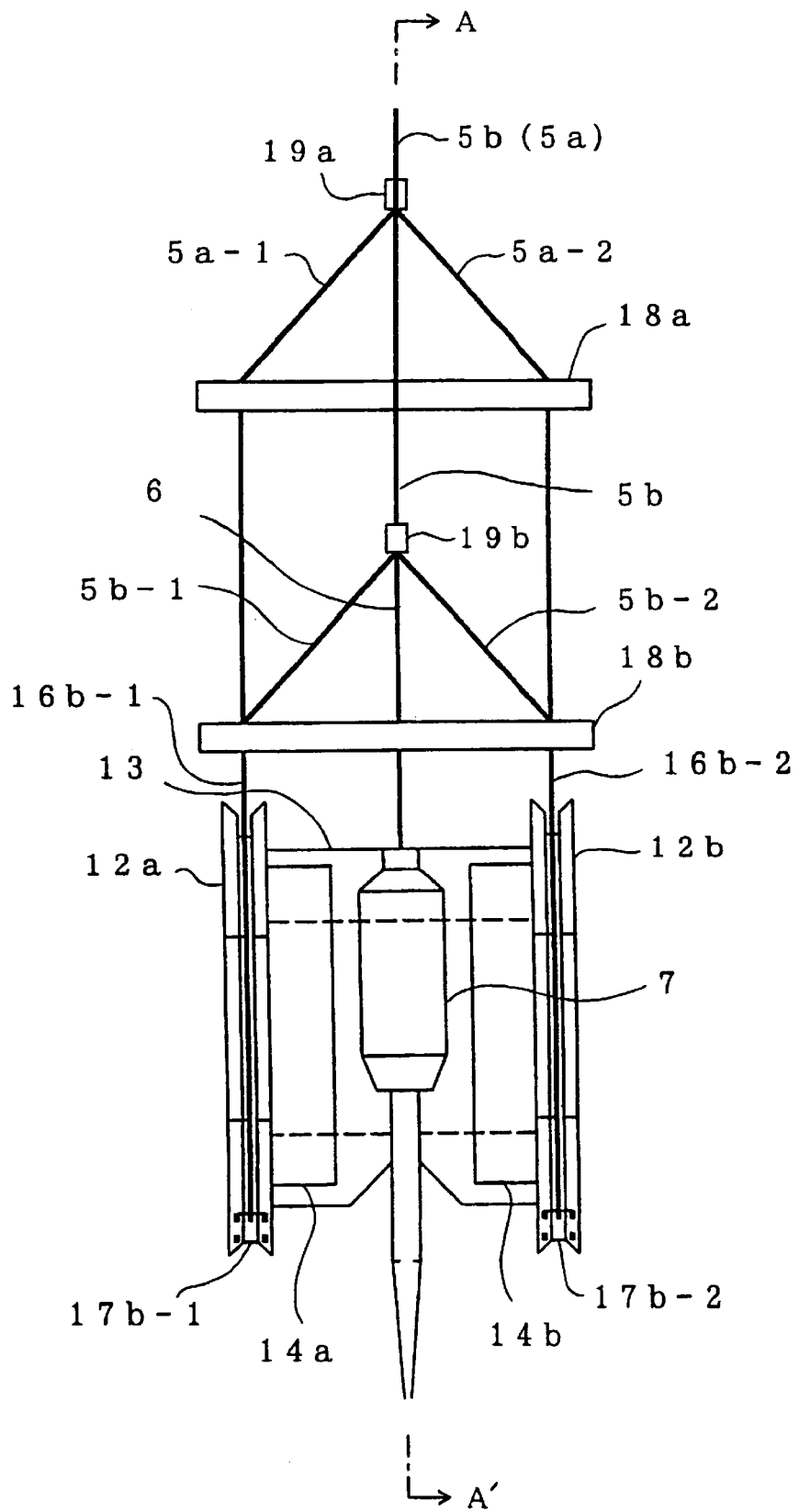
FIG. 5 is a side view of the apparatus when the pulley means of FIG. 1 is at a first position (non-supported status)

The two wires 5a and 5b as shown in FIG. 1 are connected to two wires 5a-1 and 5a-2 and two wires 5b-1 and 5b-2 respectively via wire stoppers 19a and 19b near the lower ends as shown in FIG. 5. The two wires 5a-1 and 5a-2 are arranged with a predetermined spacing using a connecting rod 18a, and the other two wires 5b-1 and 5b-2 are arranged with a predetermined spacing using a connecting rod 18b. The predetermined spacing as described above is determined in such manner that the wires are engaged in grooves of the pulleys 12a and 12b without causing unnecessary friction in alignment with the spacing between the two pulleys 12a and 12b, which constitute the pulley assembly 4.

Figure 6:
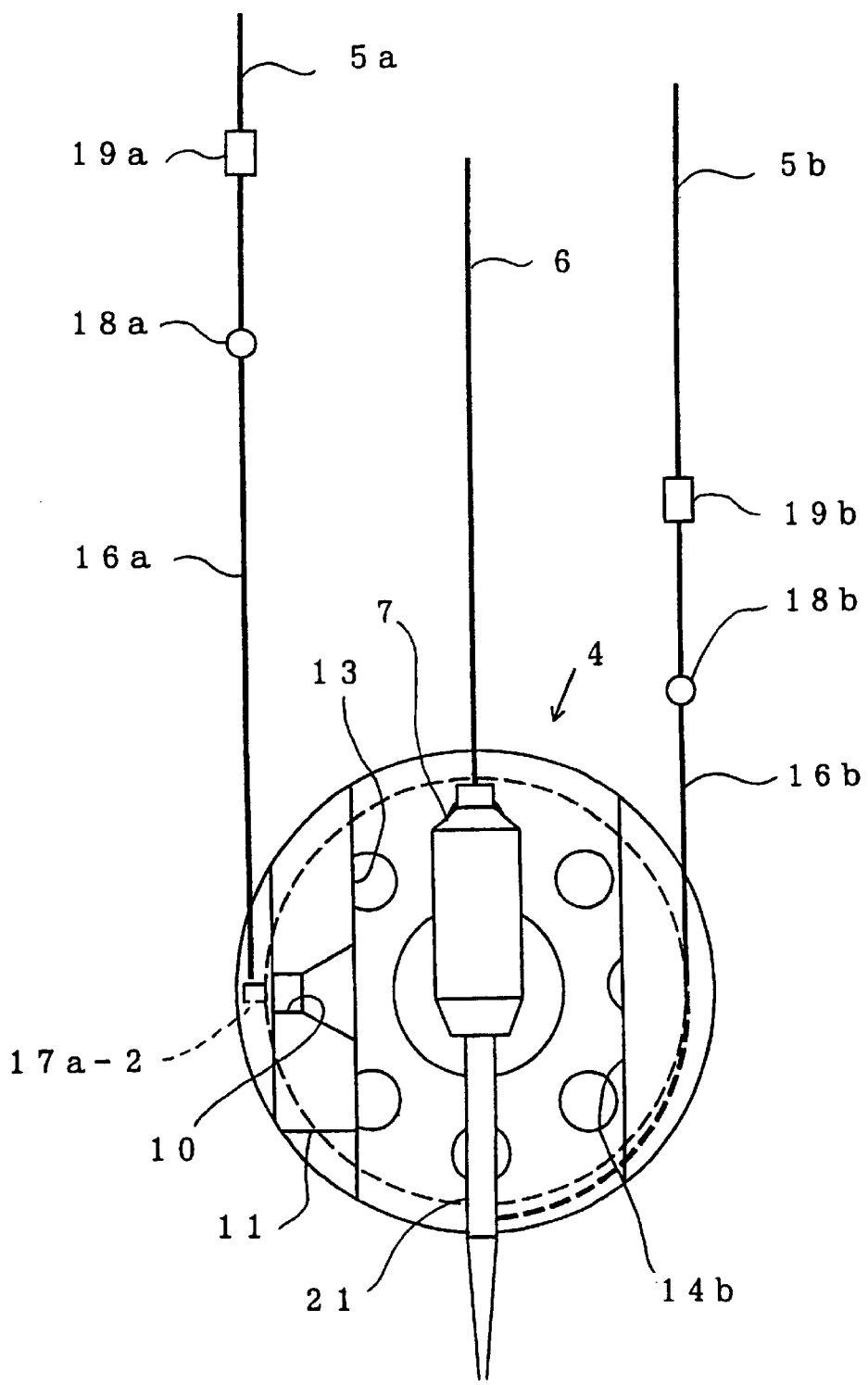
FIG. 6 is a cross-sectional view along the line A–A' in FIG. 5.
Figure 7:
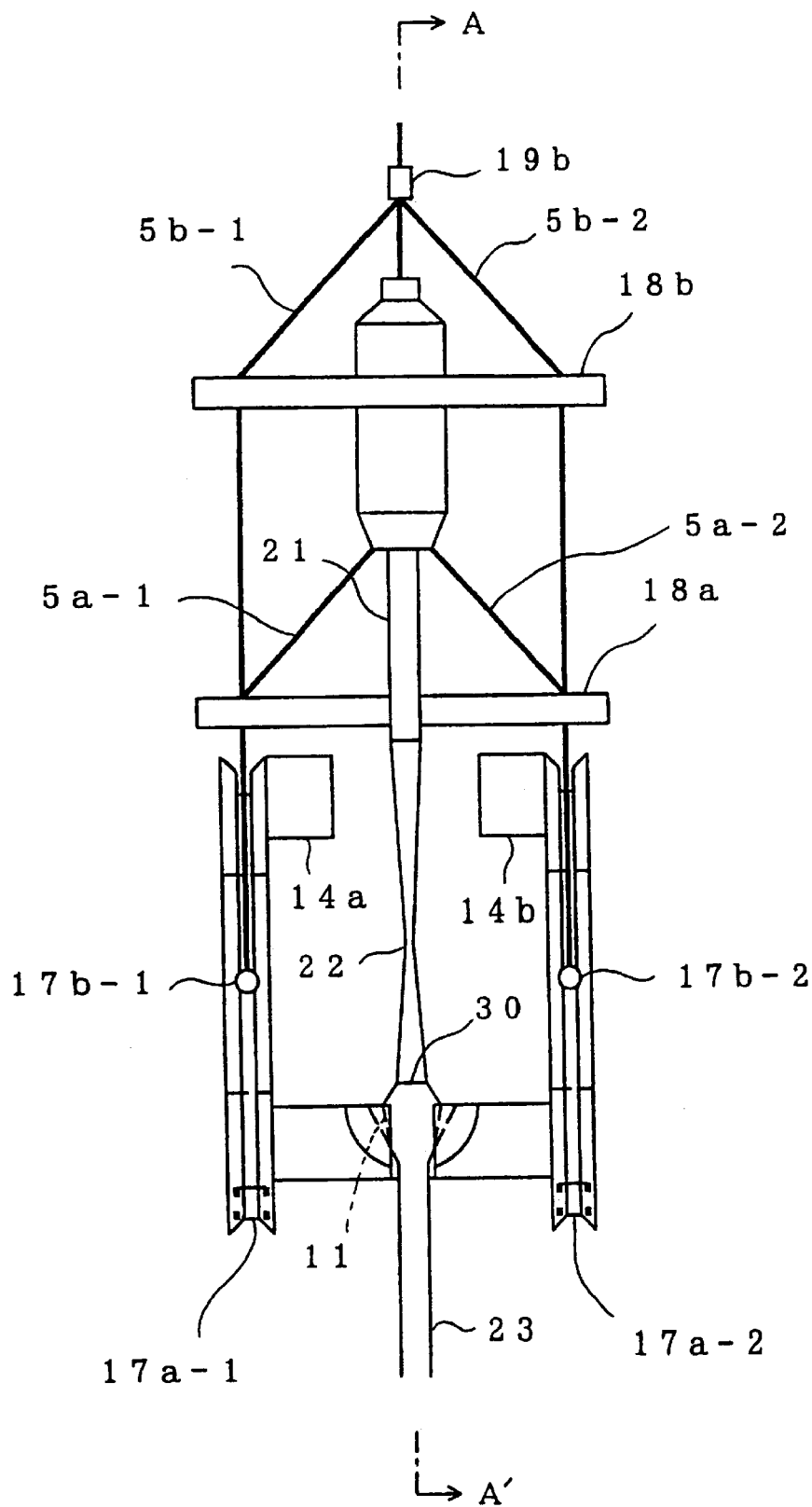
FIG. 7 is a cross-sectional view when the pulley means of FIG. 1 is at a second position (supported status)
Figure 8:
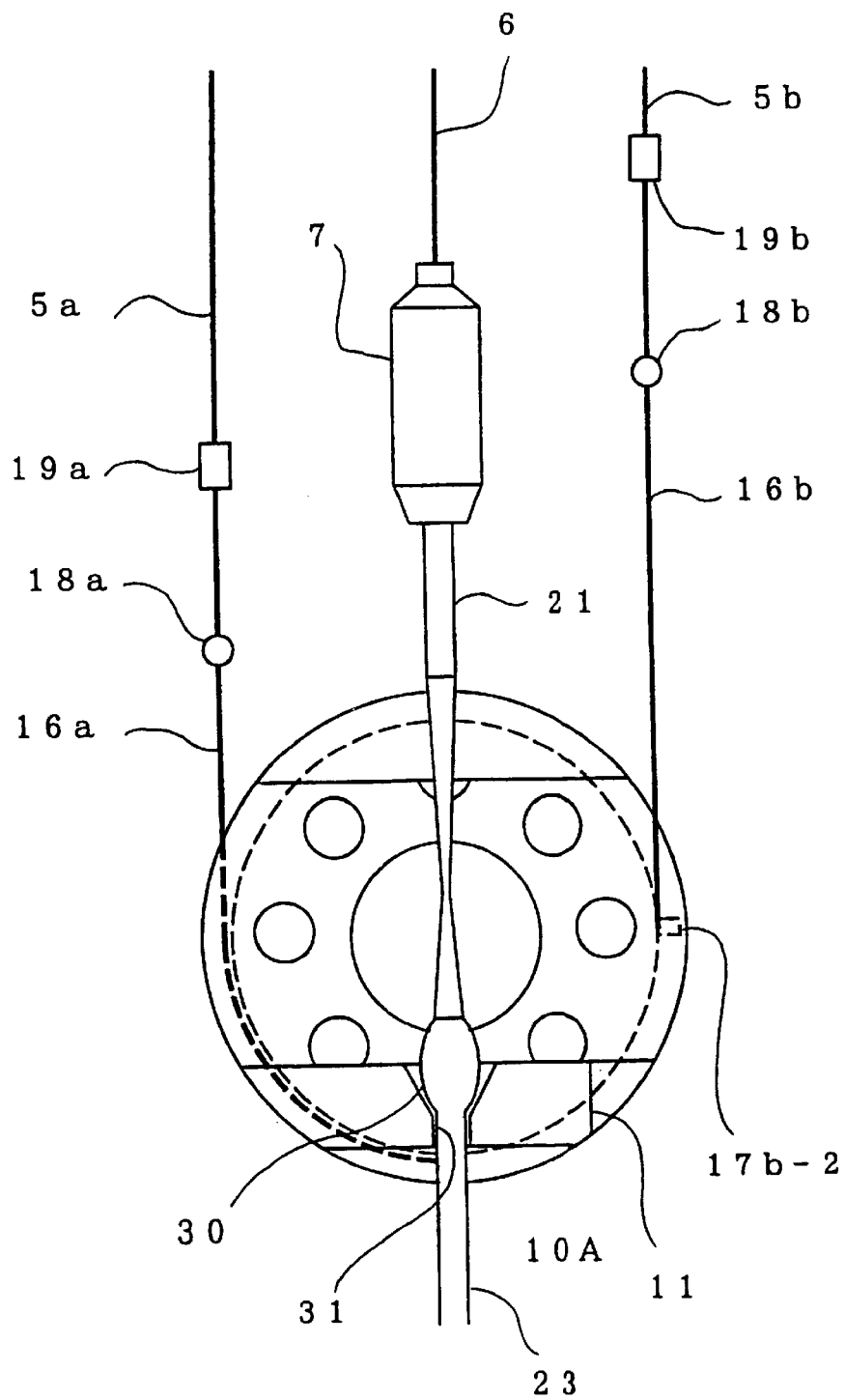
FIG. 8 is a cross-sectional view along the line A–A' in FIG. 7.

FIG. 5 is a side view of the pulley assembly 4, which is at a first position where the dish-like member 13 is not supporting a portion with larger diameter 30 formed below the seed crystal 21, and FIG. 6 is a cross-sectional view showing the same status (as seen toward the right from the line A–A' of FIG. 5). FIG. 7 represents a side view of the pulley assembly 4, which is at a second position where the dish-like member 13 is supporting the portion with larger diameter 30 formed below the seed crystal 21. FIG. 8 is a cross-sectional view of the same status (as seen toward the right from the line A–A' in FIG. 6). As shown in FIG. 5 to FIG. 8, the tip of each of the wires 16a-1 and 16a-2 is fixed on each of wire engaging portions 17a-1 and 17a-2 arranged at positions which correspond to the vicinity of the through-hole 10 of the dish-like member 13. The tip of each of the wires 16b-1 and 16b-2 is fixed on each of the wire engaging portions 17b-1 and 17b-2 which are deviated by about 45 degrees from the center of the pulleys 12a and 12b respectively from the positions where the tips of the wires 16a-1 and 16a-2 are mounted.

The apparatus of the first embodiment is operated as follows: By rotation of the winding apparatus 1, the seed crystal pulling wire 6 is unwound, and the seed crystal 21 is immersed in a raw material melt 33 in a quartz crucible 32. Then, the winding apparatus 1 is rotated in reverse direction, and the seed crystal 21 is pulled up and the single crystal 8 is grown. In this case, by controlling the pulling rate, Dash's neck as already known is formed, and a portion with larger diameter 30 is then formed. Until the portion with larger diameter 30 is formed, the pulley assembly 4 is in the status as shown in FIG. 5 and FIG. 6, and the portion with larger diameter 30 is not supported by the dish-like member 13. When the portion with larger diameter 30 is moved up to a predetermined height, the winding drums 3a and 3b are operated to rotate the pulley assembly 4, and the dish-like member 13 moves the pulley assembly 4 from the position under the portion with larger diameter 30 to a position to support the portion with larger diameter 30. In this case, a narrow single crystal portion 23 under the portion with larger diameter 30 is guided toward the through-hole 10 through the slit 11 of the dish-like member 13. Positioning by rotation of the pulley assembly 4 may be determined by amount of wining up or winding down of the wires 5a and 5b as fixed in advance, but it is preferable to accurately determine by visual inspection or by image recognition processing, considering the elongation of the wires 5a and 5b. A portion with smaller diameter under the portion with larger diameter 30 is also called as a constricted portion.

Under this condition, the dish-like member 13 is at a position slightly lower than the portion with larger diameter 30 where it is not brought into contact with the latter. Then, the winding drums 3a and 3b are operated, and the pulley assembly 4 is moved up without rotating, and it is moved up to such extent that the lower portion of the portion with larger diameter 30 is supported by a tapered recess 10A of the dish-like member 13. When the dish-like member 13 comes into contact with the lower part of the portion with larger diameter 30, the load applied on the wire 6 is decreased. This status is detected by the load cell 2, and it is outputted as a load cell signal. A CPU (central processing unit) in a control unit (not shown) receives this load cell signal via an interface. The winding drums 3a and 3b are synchronously rotated until the load applied on the wire 6 is decreased to a certain value, and the dish-like member 13 is moved up.

When the load applied on the wire 6 is turned to the predetermined value, number of revolutions of the winding drums 3a and 3b are controlled in such manner that diameter of the single crystal to be grown and the crystal growing rate will be the values as desired. Specifically, up to this moment, the control of the pulling rate of the single crystal is controlled by the winding apparatus 1, which pulls up the seed crystal 21. After the dish-like member 13 begins to reliably support the portion with larger diameter 30, it is controlled by the rotation of the winding drums 3a and 3b only. In other words, the winding apparatus 1 will not contribute to the control of crystal growth, and it may be controlled in such manner that a predetermined tension is always applied on the wire 6.

Figure 9:
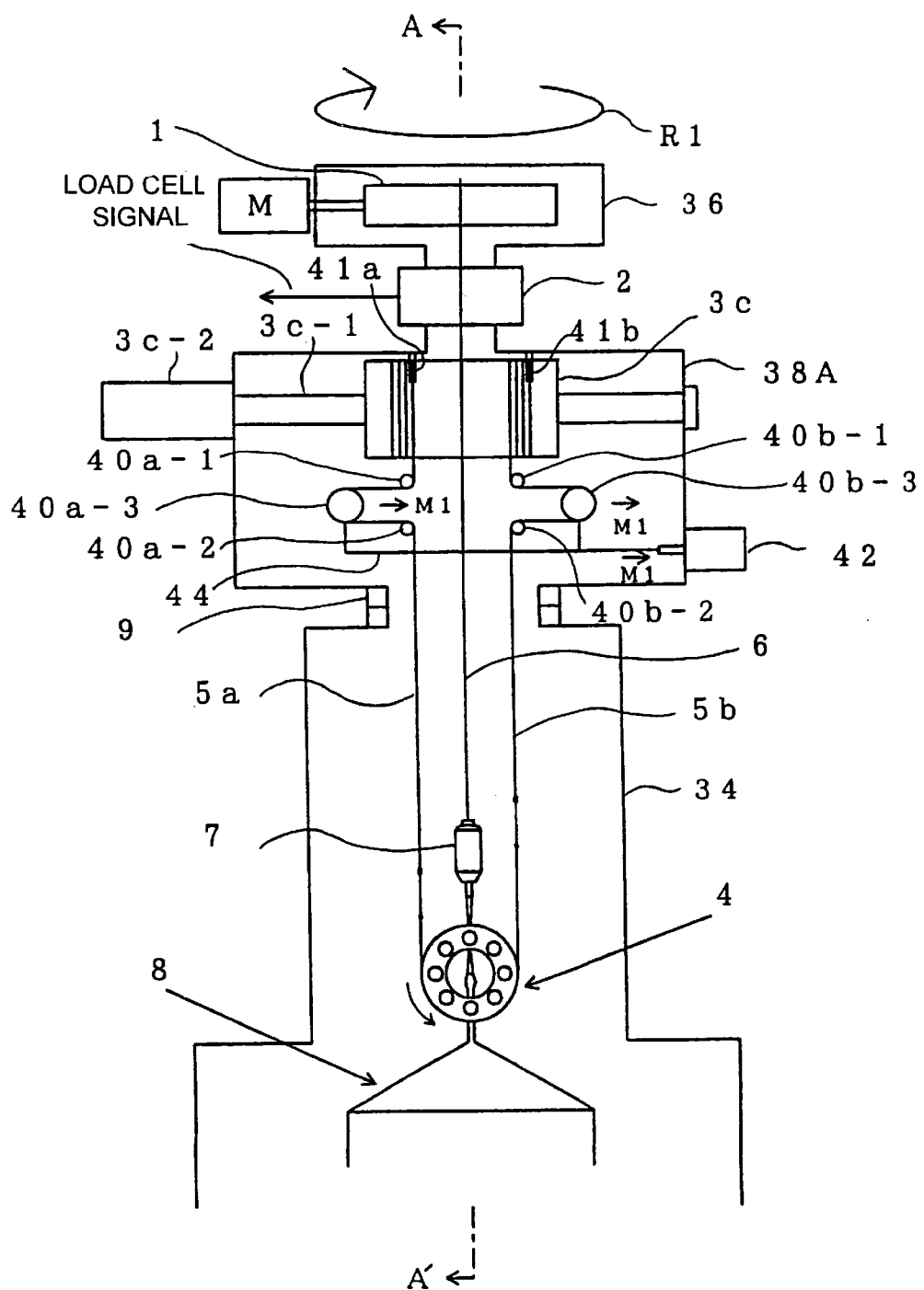
FIG. 9 is a partial cross-sectional view schematically showing a second embodiment of the single crystal pulling apparatus of the present invention.
Figure 10:
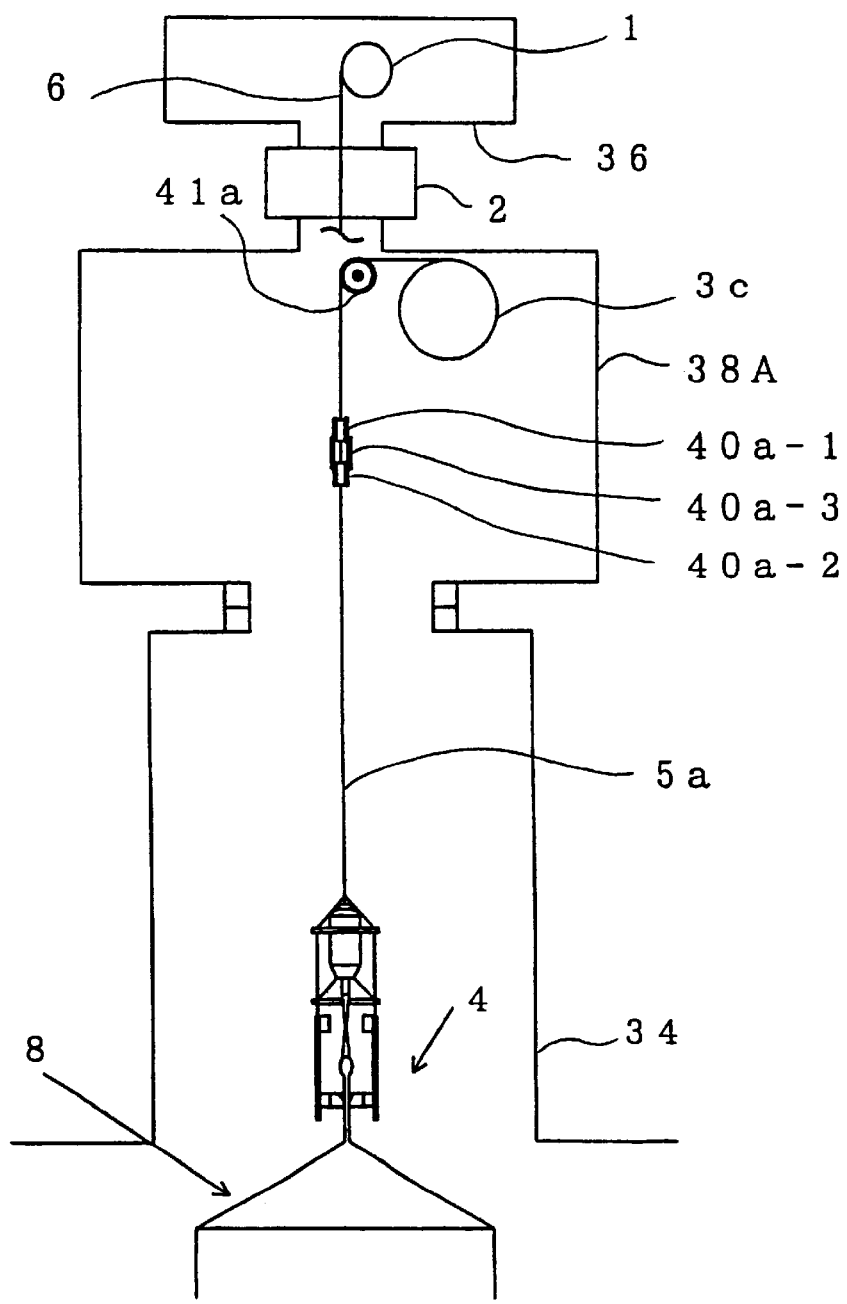
FIG. 10 is a cross-sectional view along the line A–A' in FIG. 9.

Next, description will be given on a second embodiment of the present invention. FIG. 9 is a cross-sectional view schematically showing the second embodiment of the single crystal pulling apparatus of the present invention. FIG. 10 is a lateral sectional view along arrows A–A' in FIG. 9 as seen from the right side. Specifically, in the first embodiment, the two wires 5a and 5b are wound up by means of the two winding drums 3a and 3b. In the second embodiment, the two wires 5a and 5b are wound up by a single winding drum 3c. In the first embodiment, the wire 5a is wound down while the wire 5b is wound up, and the pulley assembly 4 is rotated to move the dish-like member 13 to a predetermined position. In the second embodiment, the single winding drum 3c is used only for moving up the pulley assembly 4, and the moving of the dish-like member 13 toward the predetermined position caused by the rotation of the pulley assembly 4 is carried out by means to move a part of the wires 5a and 5b in horizontal direction.

The wires 5a and 5b are designed in such manner that these wires are first engaged on fixed pulleys 40a-1, 40a-2, 40b-1, and 40b-2 and on two movable pulleys 40a-3 and 40b-3. Then, these wires are wound up on the winding drum 3c via the two fixed pulleys 41a and 41b. The fixed pulleys 40a-1, 40a-2, 40b-1, 40b-2, 41a and 41b and the movable pulleys 40a-3 and 40b-3 are accommodated in the same chamber 38A as the winding drum 3c. This chamber 38A is integrally connected with the upper chamber 36 in the same manner as the chamber 38 of the first embodiment, and it is further rotatably supported with respect to the mechanical chamber 34 via a ball bearing 9. A rotation shaft 3c-1 of the wining drum 3c is connected to a motor 3c-2, which is mounted externally on the chamber 38A.

The movable pulleys 40a-3 and 40b-3 are connected to a linearly moving mechanism 42 arranged on outer side of the chamber 38A via a link 44 and it is movable in a direction shown by an arrow M1 in FIG. 9. The distance of horizontal movement of the movable pulleys 40a-3 and 40b-3 by the linearly moving mechanism 42 is set to such a distance that it is necessary and sufficient for the rotation of the pulley assembly 4 at an angle of 90 degrees. That is, as already explained in the first embodiment, in order to rotate the pulley assembly 4 at an angle of 90 degrees from the status shown in FIG. 5 and FIG. 6 (non-supporting position) to the status shown in FIG. 7 and FIG. 8 (supporting position), when the movable pulley 40a-3 is moved rightward in the figure, the lower end of the wire 5a is moved down. On the other hand, when the movable pulley 40b-3 is moved rightward in the figure, the lower end of the wire 5b is moved up. The other operation is the same as in the first embodiment, and detailed description is not given here.

Figure 11:
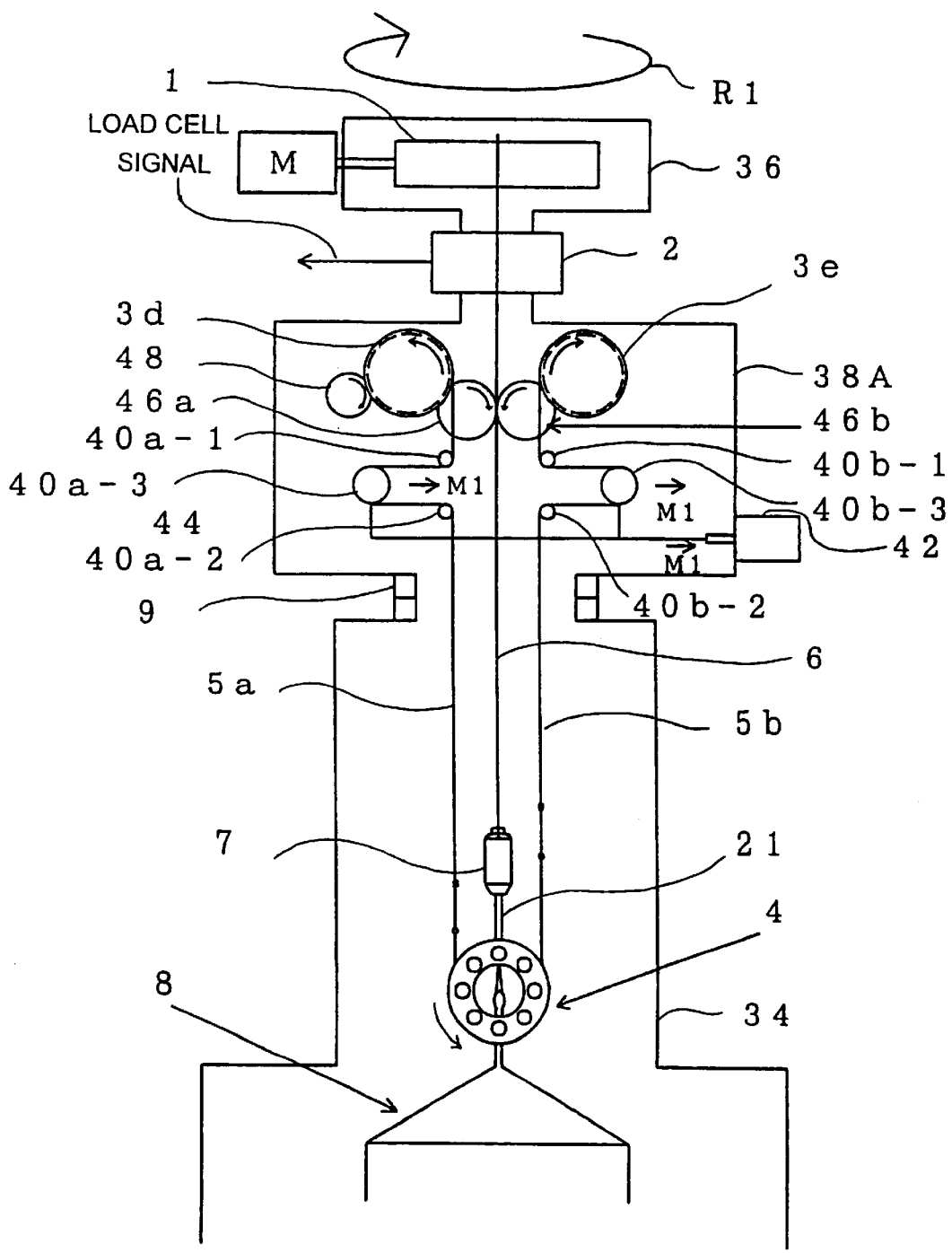
FIG. 11 is a partial cross-sectional view schematically showing a third embodiment of the single crystal pulling apparatus of the present invention.

Next, description will be given on a third embodiment of the present invention referring to FIG. 11. Like the first embodiment, the third embodiment comprises two winding drums 3d and 3e. Further, like the second embodiment, the third embodiment comprises fixed pulleys 40a-1, 40a-2, 40b-1 and 40b-2 as well as horizontally movable pulleys 40a-3 and 40b-3 and further, the linearly moving mechanism 42. In the first embodiment, the two winding drums 3a and 3b are electrically and synchronously rotated during lifting of the pulley assembly 4, while, in the third embodiment, the two winding drums 3d and 3e are connected with each other by two gears 46a and 46b. Rotation of the motor 48 is transmitted to the winding drum 3d, and rotation of the winding drum 3d is transmitted to the winding drum 3e via the two gears 46a and 46b. Therefore, synchronous rotation of the two winding drums 3d and 3e is very stable and reliable.

In the third embodiment, the pulley assembly 4 is rotated by 90 degrees by the linearly moving mechanism 42 as in the second embodiment, and the pulley assembly 4 is lifted up by the rotation of the two winding drums 3d and 3e as in the first embodiment. The arrangement to move a part of the wires 5a and 5b in horizontal direction by the linearly moving mechanism 42 as used in the second and the third embodiments may also be applied to the first embodiment. This arrangement is defined as a fourth embodiment of the invention. In this fourth embodiment, the two winding drums 3a and 3b as seen in the first embodiment are used only in the lifting operation of the pulley assembly 4, and the rotation of the pulley assembly 4 is entrusted to the linearly moving mechanism 42.

As described above, in the second, the third and the fourth embodiments, a part of the wires 5a and 5b is moved horizontally by means of the linearly moving mechanism 42, and the pulley assembly 4 is rotated. As a result, a mechanism to rotate the pulley assembly 4 is independent from the lifting mechanism to lift up the pulley assembly 4 and to grow the single crystal. Therefore, the two ways of control can be carried out independently from each other, and it is also possible to simplify the control mechanism. In each of the above embodiments, the change of load on the wire 6 is detected by the load cell 2, and timing for the load moving is determined, whereas it may be determined in such manner that the portion with larger diameter 30 is identified by simultaneous use of pattern recognition using CCD image pickup element or by visual inspection.

The space inside the mechanical chamber 34 is maintained under airtight or at vacuum conditions or filled with inert gas using a sealing member (not shown). It is difficult to perfectly separate the upper portion of the mechanical chamber 34, i.e. the chamber 38 (38A), from the mechanical chamber 34 because the wires 5a and 5b are placed between the mechanical chamber 34 and the chamber 38. However, it is preferable to arrange the sealing member as far as possible so that dust and particles generated in the chamber 38 (38A) may not exert influence on the mechanical chamber 34.

Industrial Applicability

As described above, according to the present invention, the lower part of the portion with larger diameter formed under the Dash's neck during the processing of single crystal growth is supported from below by the dish-like member which has a slit and is rotatable. Lifting of the dish-like member is performed by lifting up the pulley means mounted on the dish-like member while controlling the rate. Then, the control of the single crystal growth is shifted from the pulling means for pulling up the seed crystal to the means for lifting up the pulley means. As a result, it is possible to perfectly support the portion with larger diameter by the pulley means. Even when power suspension occurs during crystal growing operation, there will be no change in the force to support the crystal, and the load can be smoothly shifted from the means for pulling up the seed crystal to the means for lifting up the pulley means, and no dislocation occurs.

Also, the mechanism for supporting the portion with larger diameter has relatively simple structure and comprises less number of components. Because there are less movable parts and sliding parts compared with the cases of the other conventional methods, it is possible to reduce dust and particles, which cause trouble to the apparatus or to hinder the growth of crystal. Further, temperature is high near the crystal, but all of the driving mechanisms to rotate or lift up the dish-like member are arranged at positions separated from the crystal, and no means is required for cooling down the driving mechanisms.

What is claimed is:

1. A single crystal pulling method wherein said method comprises: a step of forming a portion with larger diameter by controlling the pulling rate with said seed crystal being pulled up by said seed crystal pulling means; a step of positioning said support base under said portion with larger diameter with said support base being rotated by said pulley rotating means; a step of lifting said pulley lifting means; a step of detecting that the measured load is at a predetermined value by measuring a load on said seed crystal pulling means; and a step of starting to control the rate for single crystal growth by said pulley lifting means by stopping to control the rate for single crystal growth by said seed crystal pulling means.

2. A single crystal pulling apparatus, comprising rotating means for rotating a seed crystal holder around pulling direction to support a seed crystal above a crucible capable to hold a molten crystal, seed crystal pulling means for pulling up said seed crystal by moving up said seed crystal holder while controlling pulling rate, a support base as a dish-shaped member to support a portion with larger diameter by supporting and placing said portion with larger diameter formed under said seed crystal, pulley means for rotating said support base and being movable between a position not to support and a position to support the lower end of a constricted portion or the portion with larger diameter of a single crystal depending on rotation angle, pulley rotating means for rotating said pulley means and for moving said support base between said two positions, pulley lifting means for moving up said support base by lifting up said pulley means while controlling the lifting rate, and means for rotating said pulley rotating means and said pulley lifting means around pulling direction of said seed crystal.

3. A single crystal pulling apparatus according to claim 1, wherein said pulley means is two pulleys parallel to each other and arranged to squeeze said support base from each side.

4. A single crystal pulling apparatus according to claim 1, wherein said pulley driving means and said pulley lifting means are provided with two winding means for winding up both ends of two wires respectively mounted on said pulley means.

5. A single crystal pulling apparatus according to claim 4, wherein driving sources for driving said two winding means are provided independently from each other.

6. A single crystal pulling apparatus according to claim 4, wherein there is provided a single driving source for driving said two winding means, and said pulley means is lifted up by rotating said pulley means.

7. A single crystal pulling apparatus according to claim 4, wherein there is provided a single driving source for driving said two winding means and said two winding means are coupled by a gear and are synchronously rotated.

8. A single crystal pulling apparatus according to claim 1, wherein said pulley lifting means is provided with a single winding means for winding up both ends of two wires mounted respectively on said pulley means.

9. A single crystal pulling apparatus according to claim 7, wherein said pulley driving means is provided with linearly moving means for moving a part of each of said two wires in horizontal direction at the same time.

10. A single crystal pulling apparatus according to claim 9, wherein said linearly moving means is engaged with said two wires respectively, being movable in horizontal direction, and is provided with two movable pulleys being movable in horizontal direction and also rotatable.

11. A single crystal pulling apparatus according to claim 10, wherein said linearly moving means is further provided with at least two fixed pulleys for guiding said two wires toward said movable pulleys.

12. A single crystal pulling apparatus according to claim 1, wherein said pulley means is further provided with balance weights so that the center of gravity of a combination of said pulley means and said support base is not significantly shifted by said support base due to rotation of said pulley means.

13. A single crystal pulling apparatus according to claim 1, wherein said pulley means is designed in such manner that it is rotated around an axis perpendicular to pulling direction of said seed crystal.

14. A single crystal pulling apparatus according to claim 1, wherein there are provided counterbalance weights to said support base so that the center of gravity of said pulley means is not changed due to rotation thereof.

15. A single crystal pulling apparatus, comprising rotating means for rotating a seed crystal holder around pulling direction to support a seed crystal above a crucible capable to hold a molten crystal, seed crystal pulling means for pulling up said seed crystal by moving up said seed crystal holder while controlling the pulling rate, a support base having a through-hole to receive a constricted portion of a single crystal to support the lower end of said constricted portion or a portion with larger diameter below said portion with larger diameter formed under said seed crystal and provided with a slit for communicating said through-hole with outer peripheral portion in order to guide said constricted portion through said through-hole, pulley means being movable between a position not to support and a position to support the lower end of the constricted portion or said portion with larger diameter of said single crystal depending on rotation angle, pulley rotating means for rotating said pulley means and controlling rotating angular position, pulley lifting means being rotatable together with said seed crystal holder and for lifting up said pulley rotating means while controlling the lifting rate, and capable to grow the single crystal by moving up said support base, and means for rotating said pulley rotating means and pulley lifting means around pulling direction of said seed crystal.

\* \* \* \* \*